United States Patent [19]

Wilhelm et al.

[11] Patent Number: 5,521,558
[45] Date of Patent: May 28, 1996

[54] INVERTER STAGE HAVING DIODE LOAD AND RING OSCILLATOR USING SAME

[75] Inventors: Wilhelm Wilhelm; Dirk Friedrich, both of München, Germany

[73] Assignee: Siemens Aktiengesellschaft, Munich, Germany

[21] Appl. No.: 333,739

[22] Filed: Nov. 3, 1994

[30] Foreign Application Priority Data

Nov. 3, 1993 [DE] Germany ............... 43 37 511.1

[51] Int. Cl.$^6$ .............. H03K 19/084; H03B 5/02
[52] U.S. Cl. .............. 331/57; 326/130; 327/256; 327/257; 327/287; 330/252; 330/261
[58] Field of Search ............... 331/57; 327/171, 327/256, 257, 287, 288, 258, 259, 285; 326/124, 130; 330/250, 261, 295, 296, 299, 252

[56] References Cited

U.S. PATENT DOCUMENTS

| | | | |
|---|---|---|---|
| 4,353,039 | 10/1982 | Huntley | 331/113 R |
| 4,585,957 | 4/1986 | Ooms . | |
| 5,177,378 | 1/1993 | Nagasawa . | |
| 5,243,240 | 9/1993 | Murakami et al. | 327/287 |
| 5,262,735 | 11/1993 | Hashimoto et al. | 331/57 |

FOREIGN PATENT DOCUMENTS

| | | |
|---|---|---|
| 0031947 | 7/1981 | European Pat. Off. . |
| 0430653 | 6/1991 | European Pat. Off. . |
| 2824275 | 12/1979 | Germany . |
| 859045 | 1/1961 | United Kingdom . |

OTHER PUBLICATIONS

"Ring–Oscillator Circuit . . . ", Kurata et al., IEEE Transation . . . , vol. ED–32, No. 6, Jun. 1985, pp. 1086–1091.
Patents Abstracts of Japan, vol. 4, No. 14 (E-169) Jan. 31, 1980 & JP-A-54-153564 (Nippon) Mar. 12, 1979.

*Primary Examiner*—Siegfried H. Grimm
*Attorney, Agent, or Firm*—Herbrt L. Lerner; Laurence A. Greenberg

[57] ABSTRACT

An inverter stage includes a supply voltage terminal and a reference potential terminal. An npn transistor has a base terminal for receiving an input signal, a collector terminal for supplying an output signal, and an emitter terminal. A controllable current source is connected between the emitter terminal of the transistor and the reference potential terminal. A series circuit of at least two diodes is connected between the supply voltage terminal and the collector terminal of the transistor. A symmetrical inverter stage assembly includes two of the inverter stages being connected in parallel with the emitters of the transistors of each of the inverter stages being connected to one another. A ring oscillator includes n (n≧1) of the inverter stages connected in series. The inverter stages include first and last inverter stages, each of the inverter stages has an output and an input, and the output of the last inverter stage is connected to the input of the first inverter stage.

3 Claims, 2 Drawing Sheets

INVERTER STAGE HAVING DIODE LOAD AND RING OSCILLATOR USING SAME

BACKGROUND OF THE INVENTION

Field of the Invention

The invention relates to an inverter stage including an npn transistor having a base terminal to which an input signal can be applied, a collector terminal at which an output signal can be picked up, and an emitter terminal connected through a controllable current source to a reference potential.

Such inverter stages are used particularly in a voltage controlled oscillator (VCO). Such VCOs serve to generate a clock signal having a frequency which can be adjusted by means of an externally applicable voltage. Typically, the VCO is an element in a so-called PLL (phase-locked loop).

In principle, there are two types of such VCOs, namely RC oscillators having a change in frequency which results from a change in stroke, and ring oscillators having a change in frequency that is effected by changing a gate transit time. That is very difficult to achieve with an RC oscillator, particularly if high frequencies are needed. Although ring oscillators enable very high frequencies, nevertheless the frequency range is relatively narrow.

SUMMARY OF THE INVENTION

It is accordingly an object of the invention to provide an inverter stage, particularly for use in a ring oscillator, which overcomes the hereinafore-mentioned disadvantages of the heretofore-known devices of this general type.

With the foregoing and other objects in view there is provided, in accordance with the invention, an inverter stage, comprising a supply voltage terminal; a reference potential terminal; an npn transistor having a base terminal for receiving an input signal, a collector terminal for supplying an output signal, and an emitter terminal; a controllable current source connected between the emitter terminal of the transistor and the reference potential terminal; and a series circuit of at least two diodes being connected between the supply voltage terminal and the collector terminal of the transistor.

With the objects of the invention in view, there is also provided a symmetrical inverter stage assembly, comprising two of the inverter stages, the inverter stages being connected in parallel with the emitters of the transistors of each of the inverter stages being connected to one another.

In accordance with another feature of the invention, there is provided a capacitor connected parallel to the series circuit of the diodes.

With the objects of the invention in view, there is additionally provided a ring oscillator, comprising n (n≧1) of the series-connected inverter stages including first and last inverter stages, each of the inverter stages having an output and an input, and the output of the last inverter stage being connected to the input of the first inverter stage.

In bipolar gates made by ECL or CML technology, the transit time can only be insignificantly varied by changing the switching current, because the resistance that determines the transit time remains unchanged, and the signal stroke changes with the switch current. In the inverter stage of the invention for use in a ring oscillator, this is advantageously avoided. The otherwise usual load resistor is replaced in this case by two series-connected diodes. As a result, the operating resistance that determines the transit time is dependent on the switch current. The voltage amplification and the signal stroke of the inverter remain independent of the switching current. In the configuration of an inverter stage in a ring oscillator according to the invention, the frequency can therefore be varied within wide limits.

Other features which are considered as characteristic for the invention are set forth in the appended claims.

Although the invention is illustrated and described herein as embodied in an inverter stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
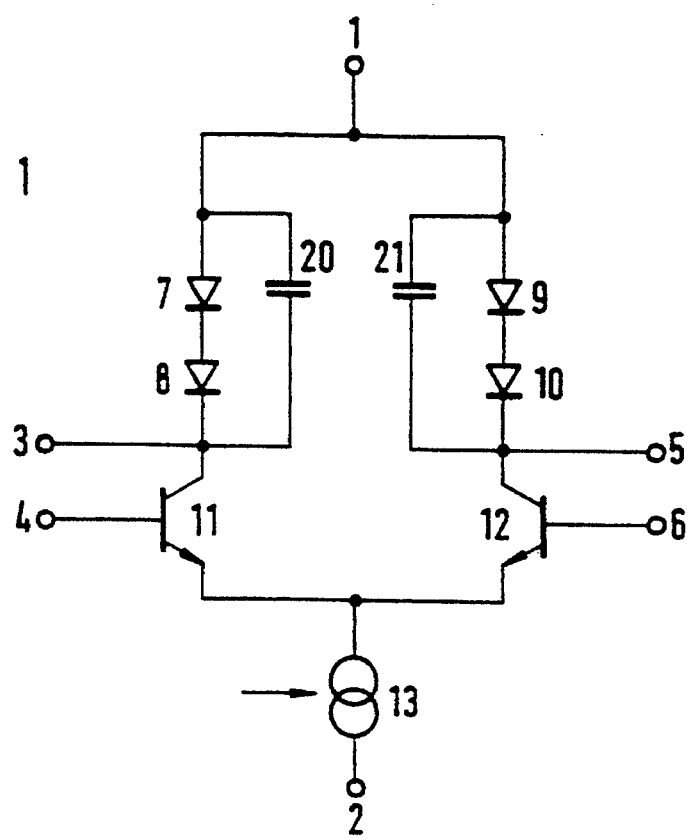
FIG. 1 is a schematic circuit diagram of a symmetrical inverter stage according to the invention.

Referring now to the figures of the drawing in detail and first, particularly, to FIG. 1 thereof, there is seen a supply voltage terminal 1 that is connected to an anode of a diode 7 and to an anode of a diode 9. The supply voltage terminal 1 is also connected to a first terminal of both a capacitor 20 and a capacitor 21. A cathode of the diode 7 is connected to an anode of a further diode 8. A cathode of the diode 8 is connected to a second terminal of the capacitor 20 and to an output terminal 3. The cathode of the diode 8 is also connected to a collector of an npn transistor 11. An emitter of the transistor 11 is connected through a controllable current source 13 to a reference potential terminal 2. A base of the transistor 11 is connected to an input terminal 4. A cathode of the diode 9 is connected to an anode of a further diode 10. A cathode of the diode 10 is connected to a second terminal of the capacitor 21, to an output terminal 5 and to a collector terminal of a further npn transistor 12. A base terminal of the transistor 12 is connected to an input terminal 6. An emitter terminal of the transistor 12 is connected to the emitter terminal of the transistor 11.

Figure 2:
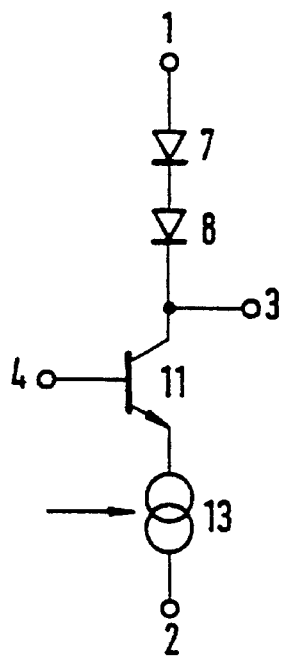
FIG. 2 is a circuit diagram of an asymmetrical inverter stage according to the invention.

FIG. 2 shows an asymmetrical inverter stage according to the invention as shown in FIG. 1. Identical components are identified by the same reference numerals. The circuit of FIG. 2 differs from that of FIG. 1 only due to the fact that the branch including the diodes 9, 10, the capacitor 21 and the transistor 12, is missing. The capacitor 20 has also been dispensed with in FIG. 2.

Figure 3:
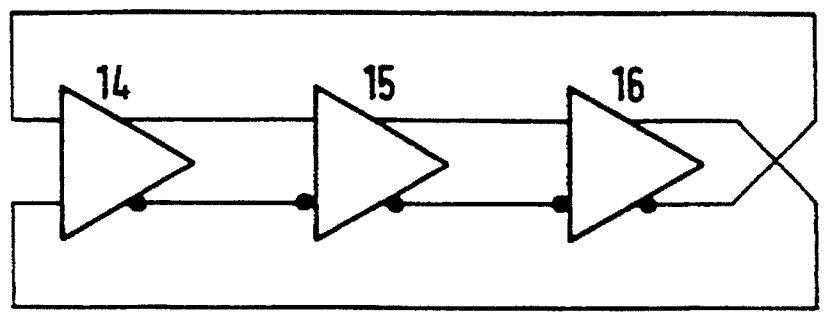
FIG. 3 is a circuit diagram of a ring oscillator with three inverter stages according to the invention as shown in FIG. 1.

The ring oscillator shown in FIG. 3 includes symmetrical inverter stages according to FIG. 1. Outputs of a first inverter stage 14 are connected to inputs of a second inverter stage 15. Outputs of the inverter stage 15 are connected to inputs of an inverter stage 16. Finally, outputs of the inverter stage 16 are connected crosswise with inputs of the inverter stage 14.

Figure 4:
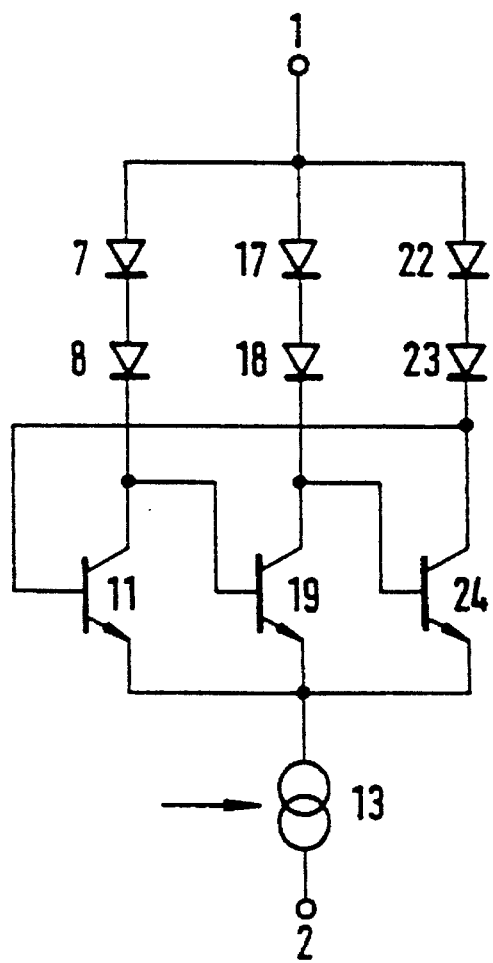
FIG. 4 is a circuit diagram of a ring oscillator with three inverter stages according to the invention as shown in FIG. 2.

The ring oscillator shown in FIG. 4 likewise includes three series-connected inverter stages. Each inverter stage is constructed as in FIG. 2. A first inverter stage includes the diodes 7, 8 and the transistor 11; a second inverter stage includes diodes 17, 18 and a transistor 19; and a third inverter stage includes diodes 22, 23 and a transistor 24. Emitters of the transistors 11, 19 and 24 are connected to one another and are connected through the controllable current source 13 to the reference potential terminal 2. Anodes of the diodes 7, 17 and 22 are likewise connected both to one another and to the supply voltage terminal 1. An output of the transistor 11, or in other words a pickup between the diode 8 and the collector of the transistor 11, is connected to a base of the transistor 19. An output of the second stage, that is a pickup between the diode 18 and a collector of the transistor 19, is connected to a base of the transistor 24. Finally, an output of the third stage, that is a pickup between the diode 23 and a collector of the transistor 24, is connected to the base of the transistor 11.

The ring oscillators shown in the drawings make frequencies up to the gigahertz range possible, and as noted above, the frequency can be varied within wide limits. Finally, it has been possible to confirm that if the number of inverters is more than 3, the oscillator begins to oscillate independently. Naturally, an arbitrary number of series-connected inverters is possible for making a ring oscillator. The series circuit of two diodes that replaces a load resistor can also be expanded by further diodes. A capacitor can be connected parallel to the series circuit of the diodes.

We claim:

1. An inverter stage, comprising:
   a supply voltage terminal;
   a reference potential terminal;
   an npn transistor having a base terminal for receiving an input signal, a collector terminal for supplying an output signal, and an emitter terminal;
   a controllable current source connected between the emitter terminal of said transistor and said reference potential terminal;
   a series circuit of at least two diodes being connected between said supply voltage terminal and the collector terminal of said transistor; and
   a capacitor connected in parallel with said series circuit of said diodes.

2. A symmetrical inverter stage assembly, comprising:
   two inverter stages, each of said inverter stages including:
   a supply voltage terminal;
   a reference potential terminal;
   an npn transistor having a base terminal for receiving an input signal, a collector terminal for supplying an output signal, and an emitter terminal;
   a controllable current source connected between the emitter terminal of said transistor and said reference potential terminal;
   a series circuit of at least two diodes being connected between said supply voltage terminal and the collector terminal of said transistor; and
   capacitors each being connected in parallel with a respective one of said series circuits of said diodes;
   said inverter stages being connected in parallel with the emitters of said transistors of each of said inverter stages being connected to one another.

3. A ring oscillator, comprising:
   n (n≧1) series-connected inverter stages including first and last inverter stages, each of said inverter stages having:
   an output and an input;
   a supply voltage terminal;
   a reference potential terminal;
   an npn transistor having a base terminal for receiving an input signal, a collector terminal for supplying an output signal, and an emitter terminal;
   a controllable current source connected between the emitter terminal of said transistor and said reference potential terminal; and
   a series circuit of at least two diodes being connected between said supply voltage terminal and the collector terminal of said transistor;
   the output of said last inverter stage being connected to the input of said first inverter stage.

\* \* \* \* \*